United States Patent

Hashimoto

[11] Patent Number: 5,914,646
[45] Date of Patent: *Jun. 22, 1999

[54] SURFACE ACOUSTIC WAVE FILTER WITH LARGER DRIVING ELECTRODE AREAS IN SOME PARALLEL RESONATORS, AND PACKAGING THEREOF

[75] Inventor: Kazushi Hashimoto, Kawasaki, Japan

[73] Assignee: Fujitsu Limited, Kanagawa, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/834,768

[22] Filed: Apr. 3, 1997

Related U.S. Application Data

[63] Continuation of application No. 08/404,377, Mar. 15, 1995, abandoned.

[30] Foreign Application Priority Data

Mar. 16, 1994 [JP] Japan ................................. 6-046121

[51] Int. Cl.$^6$ ................................. H03H 9/64; H03H 9/10
[52] U.S. Cl. ........................................ 333/195; 310/313 D
[58] Field of Search ................................. 333/193–196; 310/313 R, 313 B, 313 C, 313 D

[56] References Cited

U.S. PATENT DOCUMENTS

| | | | |
|---|---|---|---|
| 4,340,834 | 7/1982 | Sato | 310/333 |
| 4,425,554 | 1/1984 | Morishita et al. | 333/195 |
| 4,580,115 | 4/1986 | Sprengel | 333/193 |
| 5,471,178 | 11/1995 | Hickernell | 333/193 |
| 5,506,552 | 4/1996 | Seki et al. | 333/195 |
| 5,559,481 | 9/1996 | Satoh et al. | 333/193 |

FOREIGN PATENT DOCUMENTS

| | | | |
|---|---|---|---|
| 0 541 284 A1 | 5/1993 | European Pat. Off. | 333/193 |
| A-56-62416 | 5/1981 | Japan . | |
| 404263509 | 9/1992 | Japan | 333/193 |
| 405275965 | 10/1993 | Japan | 310/313 R |
| 0629779 | 2/1994 | Japan . | |
| 0669730 | 3/1994 | Japan . | |
| 406164309 | 6/1994 | Japan | 333/193 |
| 6291600 | 10/1994 | Japan . | |

*Primary Examiner*—Robert Pascal
*Assistant Examiner*—Barbara Summons
*Attorney, Agent, or Firm*—Nikaido Marmelstein Murray & Oram LLP

[57] ABSTRACT

A surface acoustic wave filter element is formed by replacing with a single parallel resonator having a driving electrode whose area is equal to the sum total of the areas of driving electrodes of a plurality of consecutive parallel resonators arranged in a ladder shape, together with serial resonators, for structuring a surface acoustic wave resonator. Also, in a surface acoustic wave filter formed by packaging the surface acoustic wave filter element, ground electrodes of the parallel resonators of the filter element are electrically insulated from each other and are connected to different electrode pads for grounding.

8 Claims, 8 Drawing Sheets

SURFACE ACOUSTIC WAVE FILTER WITH LARGER DRIVING ELECTRODE AREAS IN SOME PARALLEL RESONATORS, AND PACKAGING THEREOF

This application is a continuation of application Ser. No. 08/404,377 filed Mar. 15, 1995, now abandoned.

BACKGROUND OF THE INVENTION

1. Field of the Invention

This invention pertains to a surface acoustic wave filter element and a surface acoustic wave filter made by packaging it.

2. Description of the Related Arts

Recently, the use of cellular telephone sets and other cordless telephone sets is becoming more prevalent than ever before. It is estimated that the day will be soon when each person will carry a PHP (Personal Handy Phone) set, which will be a cordless telephone set of the next generation. When its network system is realized, its demand is expected to soar.

Cellular telephone sets have rapidly spread because they have become more compact in size and lighter in weight, thus light enough to be portable, in addition to a telephone having already been an indispensable communications tool. The receiver set of such a telephone set incorporates a filter for its high frequency circuit. The most recent cordless telephone sets adopts as such a filter a surface acoustic wave filter using a surface acoustic wave element, for further reductions in size and weight.

A surface acoustic wave filter has the following features:

(1) Because it can be manufactured by a photolithograph as with an LSI, it is highly reliable and can be put into use without an adjustment. Also, it is suitable for mass production.

(2) Because the velocity of a surface acoustic wave is about ten-millionths of an electromagnetic wave, it can be easily made more compact and lighter.

Because a surface acoustic wave filter can handle frequencies higher than a crystal quartz filter, its applications are expected for communications of the next generation, such as satellite communications.

The filter of a transmitter or a receptor for use e.g. in such cellular telephone sets must have a minimum insertion loss for maximizing the reception and a large extra-band attenuation for suppressing an unnecessary signal.

FIG. 1 is a circuit diagram illustrating the conventional configuration of a surface acoustic wave filter.

More specifically, FIG. 1 shows the circuit configuration of a ladder shaped surface acoustic wave filter, in which surface acoustic wave resonators are connected in cascade in a ladder form.

The surface acoustic wave filter shaped in a ladder form operates as a band-pass filter. The surface acoustic wave filter comprises four sections 10 connected serially, each with a serial resonator S and a parallel resonator P connected in an L shape, with section 10 in the last stage connected to another parallel resonator P. In a first example, a design can be made such that the resonant frequency of serial resonator S is made equal to both the anti-resonant frequency of parallel resonator P and the center frequency of a band-pass filter. This makes a range from the resonant frequency of parallel resonator P to the anti-resonant frequency of serial resonator S the band-pass range of an input signal. In a second example, another design can be made such that, to enlarge a band-pass range, the anti-resonant frequency of parallel resonator P is set smaller than the resonant frequency of serial resonator S, and that the midpoint between the anti-resonant frequency of serial resonator S and the resonant frequency of parallel resonator P is set equal to the center frequency of a band-pass filter. This makes a band-pass range from a proximity of the resonant frequency of parallel resonator P to a proximity of the anti-resonant frequency of serial resonator S the band-pass range of an input signal.

FIG. 2 is a block diagram illustrating the conventional configuration of a surface acoustic wave resonator.

More specifically, FIG. 2 shows the basic configuration of serial resonator S or parallel resonator P forming an element.

This element forms, on top of a piezoelectric board (not shown), a driving electrode 20 generally called an IDT (Inter-Digital Transducer) and a reflector (a reflecting electrode) 30 on each side of the driving electrode 20.

The driving electrode 20 is formed by two facing comb-shaped electrodes 20U and 20L locked into each other. The wave length $\lambda$ of a surface acoustic 20 wave excited on the surface of a piezoelectric board via the driving electrode 20 and the distance between two electrodes of such a driving electrode 20 (grating cycle) $l_1$ has the following relation:

$$l_1 = \lambda/2$$

Also, the reflector 30 is of a short strip type in which a plurality of electrode strips 31 are formed in parallel at the interval of a grating cycle $l_2$. The grating cycle $l_2$ is set equal to a half of the wave length $\lambda$ of a surface acoustic wave.

That is, $l_1 = l_2$.

A surface acoustic wave resonator (shown in FIG. 2) is an energy containment type resonator for obtaining a resonance characteristic by containing a surface acoustic wave in itself. It has the driving electrode 20 excite a surface acoustic wave on a surface of the piezoelectric board, has two reflectors 30 reflect a surface acoustic wave progressing on both sides of the driving electrode 20.

For improving an energy containment efficiency, such a resonator sets a lengthwise distance (hereafter called an aperture length) L2 of an aperture 32 of the reflector 30 equal to a lengthwise distance (hereafter called an aperture length) L1 of an aperture 22 formed between an upper comb-shaped electrode 20U and a lower comb-shaped electrode 20L of the driving electrode 20.

For improving the characteristics as a band-pass filter, i.e. for increasing its extra-band attenuation, of the surface acoustic wave filter whose configuration is shown in FIG. 1, it is necessary to increase the number of ladder stages, i.e. the number of the sections 10 connected in cascades. However, since this will increase the number of resonators, the overall size of the element tends to become larger, thereby presenting an obstacle in an effort to make the hardware more compact and lighter.

SUMMARY OF THE INVENTION

This invention aims at enabling ladder shaped surface acoustic wave filters connected in multiple stages to realize a large extra-band attenuation even with a small element size.

This invention pertains to a surface acoustic wave filter element composed of a plurality of surface acoustic wave resonators connected in a ladder shape, each surface acoustic wave resonator comprising a piezoelectric board, a driving electrode on top of the piezoelectric board and two reflecting electrodes provided on top of the piezoelectric board in a manner holding the driving electrode from its both sides.

In addition, this invention features a replacement of consecutive parallel resonators (e.g. two parallel resonators) with one parallel resonator having the area of a driving electrode equal to the sum total of areas of driving electrodes of the consecutive parallel resonators.

In this case, for example, the number of electrode pairs of the driving electrode of the parallel resonator used for replacement can be made greater than the number of electrode pairs of the driving electrodes of each of the consecutive parallel resonators to be replaced.

For another example, an aperture length of the driving electrode of the parallel resonator used for replacement can be made greater than an aperture length of the driving electrode of each of the consecutive parallel resonators to be replaced.

In addition to the above, this invention allows a combination method of the above two examples. That is, both the number of electrode pairs and an aperture length of the driving electrode of the parallel resonators used for replacement can be made greater than both the number of electrode pairs and an aperture length of a driving electrode of each of the consecutive parallel resonators to be replaced, respectively, at the same time.

The extra-band attenuation of a surface acoustic wave filter is dependent on the ratio $C_p/C_s$ of a driving electrode capacitance $C_p$ of a parallel resonator to a driving electrode capacitance $C_s$ of a serial resonator. Consequently, the above replacement (synthesis) of consecutive parallel resonators with a parallel resonator having a driving electrode whose area is equal to the sum total of areas of the consecutive driving electrodes hardly changes characteristics of a surface acoustic wave filter as a band-pass filter.

Further, because the replacement reduces the number of parallel resonators (reflectors), and because a wiring electrode length between serial resonators can also be shortened, an element size can be made smaller, compared with that attainable by the prior art. Also, the element size when the ladder shaped surface acoustic wave filters are provided in multiple stages can be made smaller than that attainable by the prior art.

A preferred configuration of such a surface acoustic wave filter element is to provide the ground electrodes of all parallel resonators are electrically insulated from each other.

Mutually separate provisions of the ground electrodes of all parallel resonators ensure a good ground effect, and prevent an extra-band attenuation from being deteriorated when surface acoustic wave filters are arranged in multiple stages.

Additionally, this invention features a surface acoustic wave filter made by packaging the above described surface acoustic wave filter element, in which the ground electrodes of all parallel resonators of the surface acoustic wave filter element are connected to separate electrode pads for grounding provided on the package side.

As described above, a connection of ground electrodes of parallel resonators e.g. by separate ground pads (i.e. pads for grounding) and wire bondings provided on the package side increases a ground effect and an extra-band attenuation. This ensures a surface acoustic wave filter to have good characteristics.

DESCRIPTION OF THE PREFERRED EMBODIMENT

Presented below with reference to some of the attached drawings is the description of the preferred embodiment of this invention.

Figure 3:
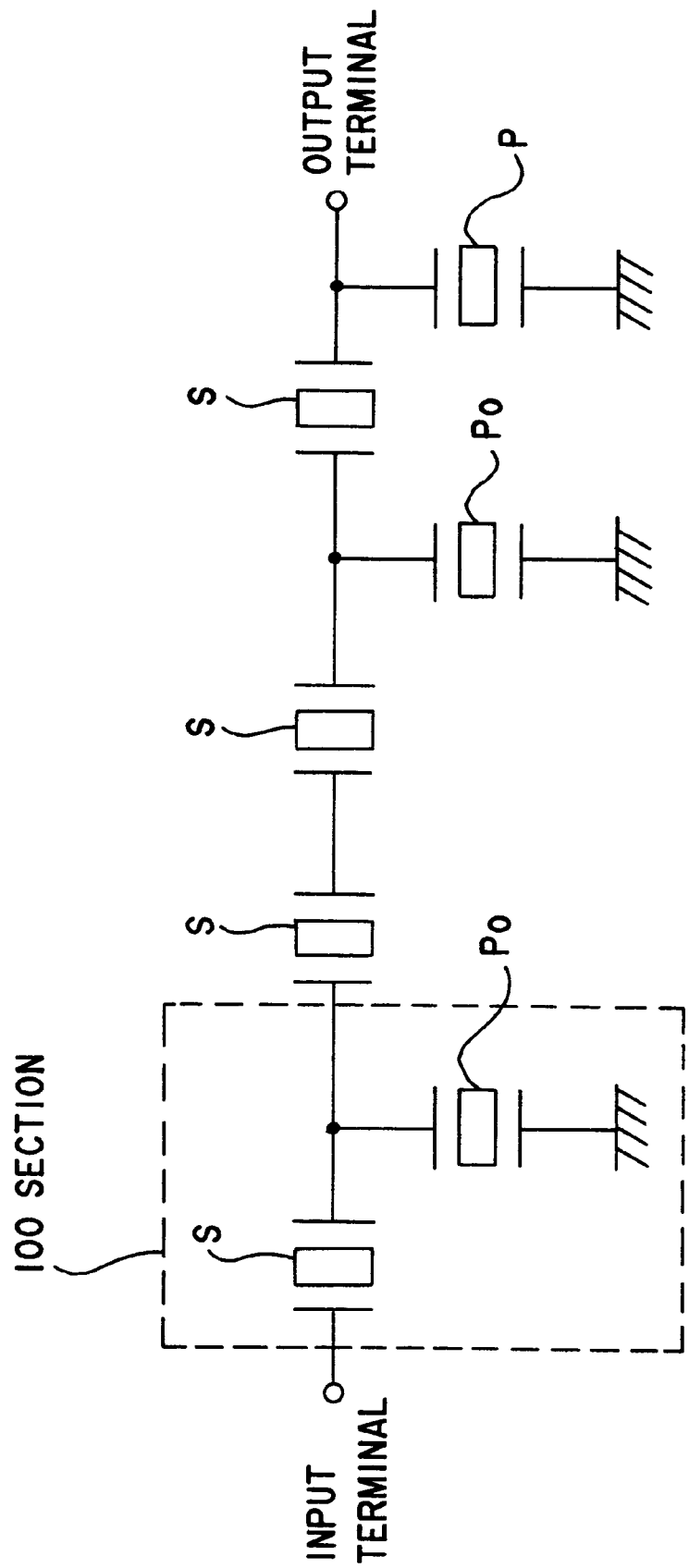
FIG. 3 is a circuit diagram illustrating the configuration of a surface acoustic wave filter pursuant to a preferred embodiment of this invention.

FIG. 3 is a circuit diagram illustrating the configuration of a surface acoustic wave filter pursuant to a preferred embodiment of this invention.

Figure 1:
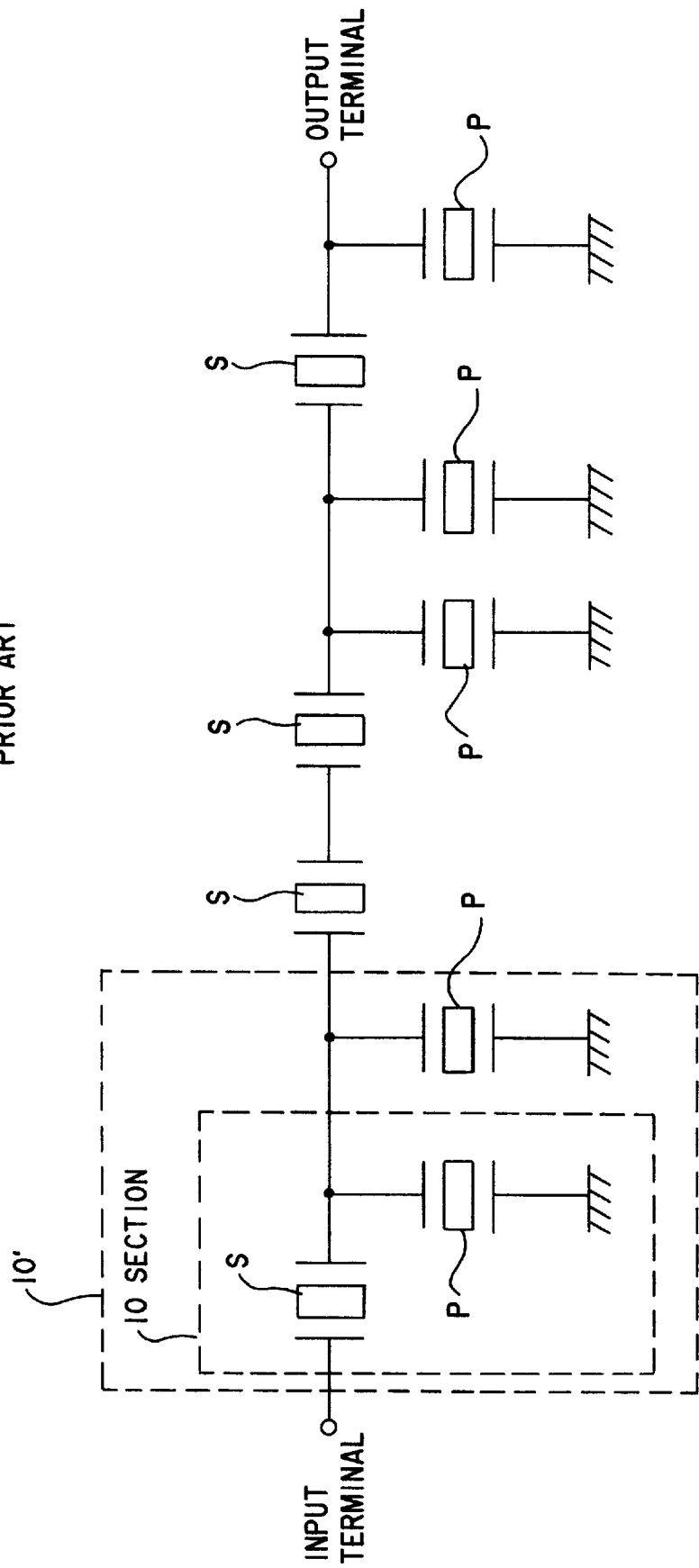
FIG. 1 is a circuit diagram illustrating the conventional configuration of a surface acoustic wave filter.

The surface acoustic wave filter (shown in FIG. 3) of this embodiment has characteristics basically similar to those of the surface acoustic wave filter (shown in FIG. 1) of the prior art. That is, a surface acoustic wave filter of this embodiment has a conventional ladder shaped surface acoustic wave filter replacing two consecutive parallel resonators P and P with one parallel resonator $P_0$. In other words, these two parallel resonators P and P are synthesized into one parallel resonator $P_0$. In this case, by making the size of the area of a driving electrode parallel resonator (synthetic parallel resonator) $P_0$ twice that of a driving electrode of parallel resonator P, the number of stages of sections 100 is made less than that attainable by the prior art, thereby enabling the overall size of a filter element to be reduced. Additionally, the area of a driving electrode of parallel resonators $P_0$ is about plural times (in this case twice) as large as the driving electrode of parallel resonator P, and the number of series resonators S (in this case four) is equal to the number of parallel resonators $P_0$ (in this case two) added the plural times. Explained below is a reason why such a configuration enables characteristics to be obtained quite similar to the ones of a conventional surface acoustic wave filter.

Figure 4:
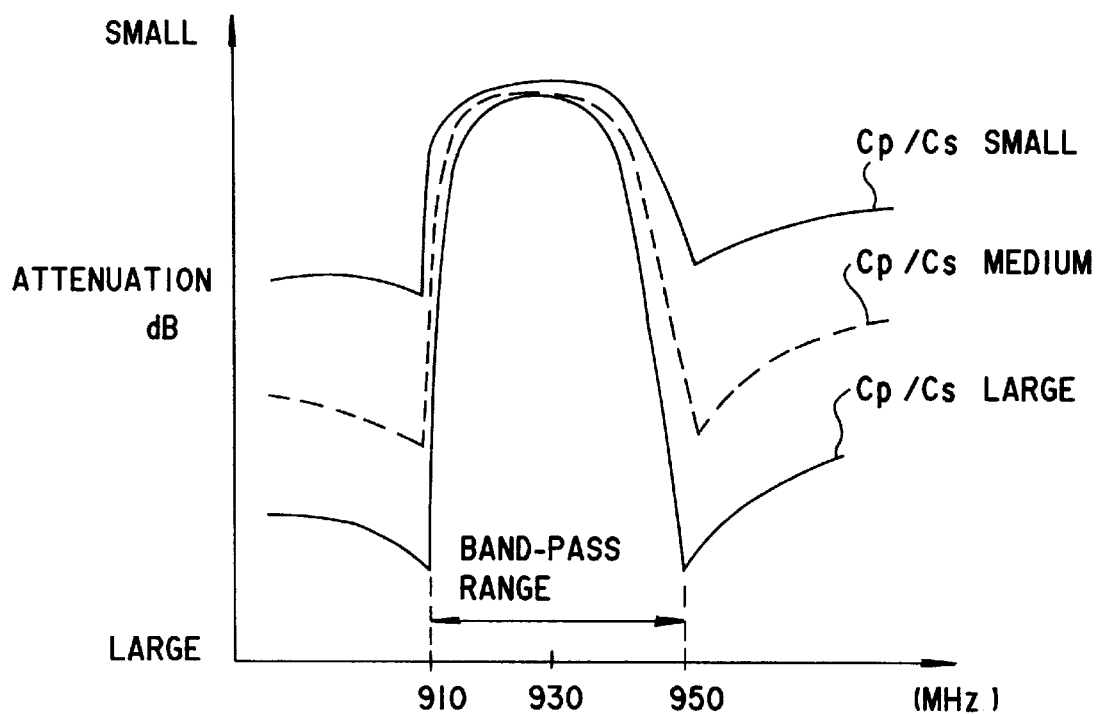
FIG. 4 is a graph illustrating the band-pass filter frequency characteristics of a surface acoustic wave filter.

FIG. 4 is a graph illustrating the band-pass filter frequency characteristics of a surface acoustic wave filter pursuant to this embodiment.

More specifically, FIG. 4 shows a relation between the ratio $C_p/C_s$ of parallel resonator electrostatic capacitance $C_p$ to serial resonator electrostatic capacitance $C_s$ for a surface acoustic wave filter and an extra-band attenuation.

The vertical axis shows an attenuation (units in decibels [dB]), while the horizontal axis shows the frequency of an input signal (units in megahertz [MHz]). It must be noted here that the closer the value is to the origin of the vertical axis, the larger the value of an attenuation is. As well, $C_p$ and $C_s$ are equivalent to capacitances between electrodes for an equivalent circuit of a surface acoustic wave resonator.

FIG. 4 shows an example of a band-pass filter having a band-pass range of nine hundred ten megahertz [910 MHz] through nine hundred fifty megahertz [950 MHz]. It shows that the larger the $C_p/C_s$ ratio is, the larger an attenuation outside of a band-pass range becomes, i.e. the more efficient the characteristics of a band-pass filter becomes.

In this embodiment, by taking advantage of such characteristics of a surface acoustic wave filter, instead of increasing the number of stages of the sections 10, the electrostatic capacitance of a driving electrode unit of parallel resonator $P_0$ is made twice as much as the electrostatic capacitance of the driving electrode unit of conventional parallel resonator P. In other words, the area of the driving electrode of parallel resonator $P_0$ is made twice as much of the area of the driving electrode of conventional parallel resonator P, thus making the characteristics of sections 100 (shown in FIG. 3) as a band-pass filter almost equivalent to those of conventional circuit 10' (shown in FIG. 1). In this case, because two parallel resonators P in the conventional circuit 10' are replaced by one parallel resonator P0, the number of reflectors is reduced from four to two. Due to such factors as a reduction in the area for a wiring part between these two parallel resonators P and P, the area of circuit 100 can be made smaller than that of conventional circuit 10'.

Described below is an example of designing a surface acoustic wave filter functioning as a band-pass filter having a circuit configuration shown in FIG. 3 whose center frequency $f_0$ is nine hundred thirty megahertz [930 MHz].

In this case, for example, as a piezoelectric board, 36° Y—X LiTaO$_3$ (lithium tantalate, i.e. a lithium salt of tantalic acid), is used. At this time, a velocity $V_s$ of a surface acoustic wave excited on the surface of the board through an application of a voltage to a driving electrode is about four thousand meters per second [4000 m/s].

As described above, to set the center frequency $f_0$ to nine hundred thirty megahertz [930 MHz], the resonant frequency of serial resonator S is set to nine hundred thirty megahertz [930 MHz], and the resonant frequency of parallel resonators $P_0$ and P is set to nine hundred twenty megahertz [920 MHz].

As described earlier, the wave length λ of a surface acoustic wave excited by a surface acoustic wave resonator is, $$\lambda = V_s/f \quad (1)$$

where, $V_s$ is the velocity of a surface acoustic wave and f is a frequency.

Figure 2:
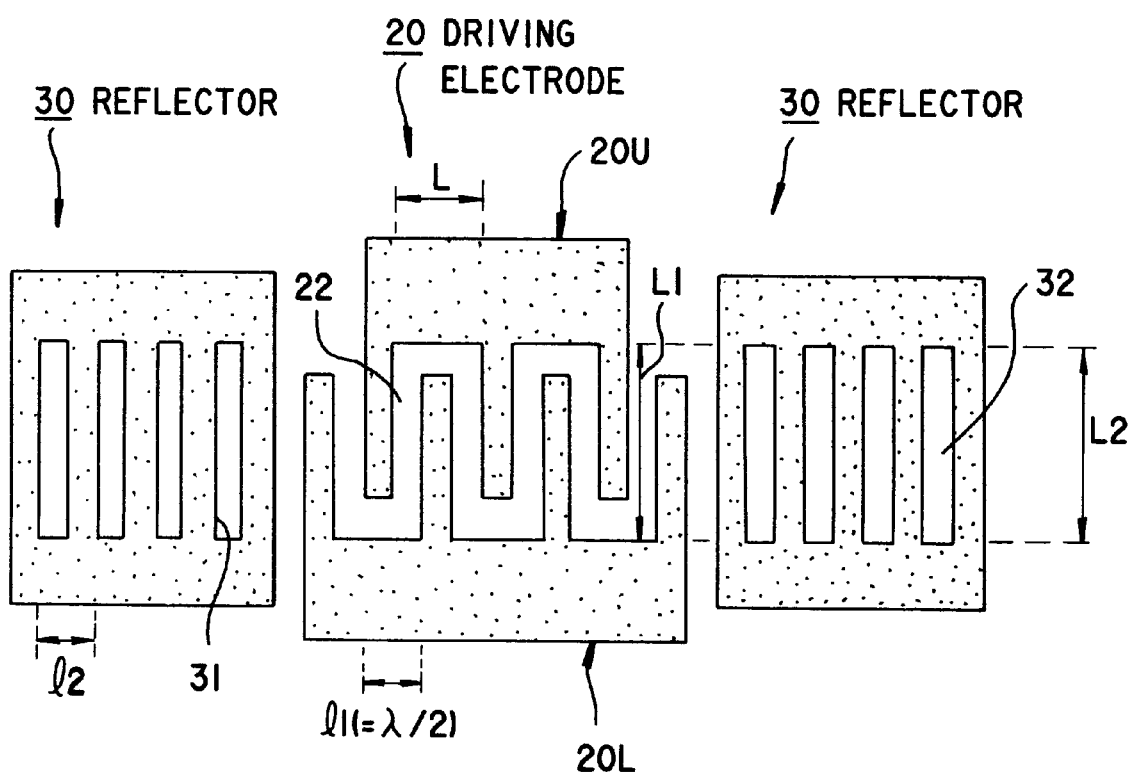
FIG. 2 is a sketch illustrating the electrode configuration of a surface acoustic wave resonator.

Besides, inasmuch as the wave length λ of the surface acoustic wave is equal to twice of the inter-electrode distance $l_1$ of a driving electrode 20, (Refer to FIG. 2.)

$$\lambda = 2l_1 \quad (2)$$

Hence, from the above expressions (1) and (2), $$2l_1 = V_s/f \quad (3)$$

Defining here as L the electrode pitch between two comb-shaped electrodes 20U and 20L, because $$L = 2l_1 \quad (4)$$

is obtained, (Refer to FIG. 2.) from the above expressions (2) and (4), $$L = V_s/f \quad (5)$$

Also, from the above expressions (2) and (4), $$L = \lambda \quad (6)$$

First, to set a resonant frequency of serial resonator S to nine hundred thirty megahertz [930 MHz], by substituting, into expression (1), f=930 MHz and $V_s$=4000 m/s, $$\lambda \approx 4.30 \, \mu m$$

is obtained.

Also, when the resonant frequency of parallel resonators P0 and P is set to nine hundred twenty megahertz [920 MHz]. Hence, by substituting f=920 MHz and $V_s$=4000 m/s into expression (1), $$\lambda \approx 4.35 \, \mu m$$

Thus, from expression (6), electrode pitch L of both the upper and lower comb-shaped electrodes 20U and 20L of the driving electrode 20 in serial resonator S is set to about four point thirty micrometers [4.30 μm], whereas electrode pitch L of those in parallel resonators $P_0$ and P is set to about four point thirty-five micrometers [4.35 μm].

Next, as an example, aperture lengths L1 and L2 of serial resonator S are set to fifty micrometers [50 μm], and the number of electrode pairs N is set to forty pairs. Also, aperture lengths L1 and L2 of parallel resonator P are set to one hundred fifty micrometers [150 μm], and the number of electrode pairs N is set to fifty pairs.

And, based on the above reason, the aperture length L1 and the number of electrode pairs N is set such that parallel resonator $P_0$ is structured to have the area of the driving electrode 20 twice as much as that of parallel resonator P.

At this time, used is a relation such that the area of a driving electrode 20 is proportionate to the product between the number of electrode pairs N and aperture length L1. Thus, for example, {1} an aperture length L1 is set to one hundred fifty micrometers [150 μm], and the number of electrode pairs N is set to one hundred [100] pairs, or {2} an aperture length L1 is set to two hundred micrometers [200 μm], and the number of electrode pairs N is set to seventy-five [75] pairs.

{1} describes a method for doubling the area of the driving electrode 20 through the doubling of the number of electrode pairs N, under which aperture length L1 is kept the same.

{2} describes a method for doubling the area of the driving electrode 20 with little increase in the number of electrode pairs N, under which aperture length L1 is enlarged.

In addition to methods {1} and {2} described above, there is a method for doubling the area of the driving electrode 20 under which {3} an aperture length L1 is doubled without changing the number of electrode pairs N.

Figure 5:
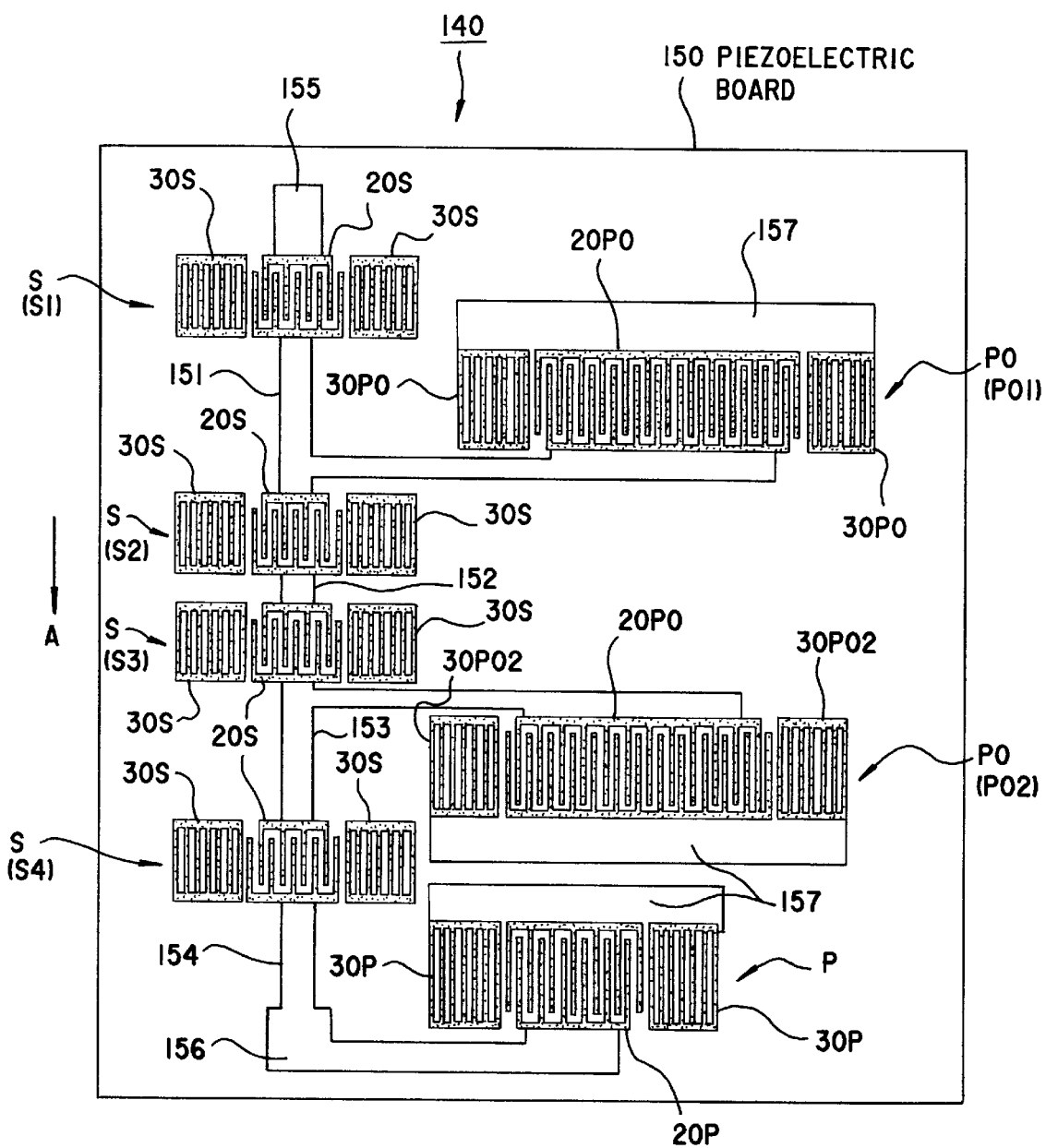
FIG. 5 is a plane view illustrating the configuration of a surface acoustic wave filter element pursuant to this embodiment.

FIG. 5 is a plane view illustrating the configuration of a surface acoustic wave filter element.

Figure 6:
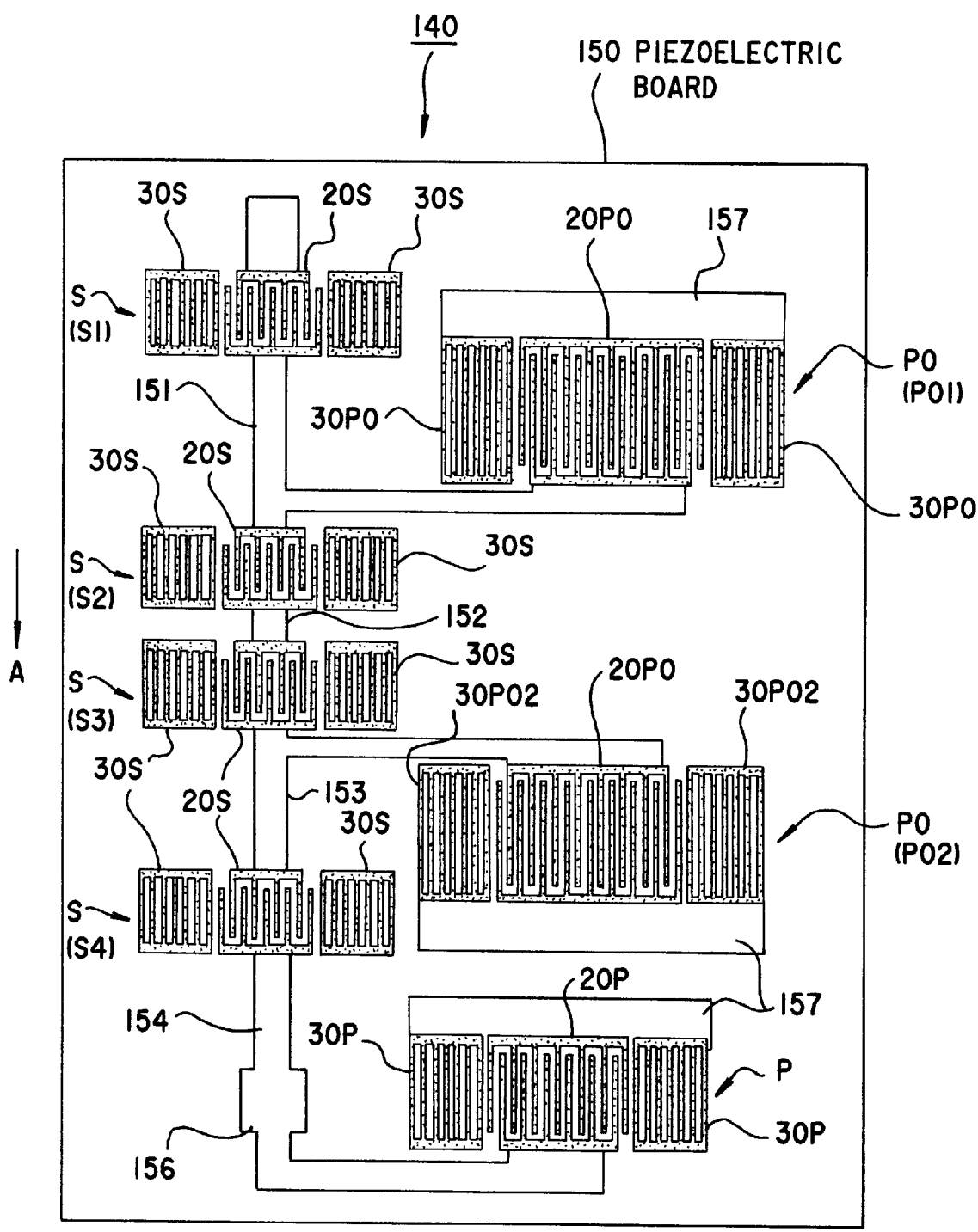
FIG. 6 is a plane view illustrating the configuration of a surface acoustic wave filter element pursuant to another embodiment.

FIG. 6 is a plane view illustrating the configuration of another surface acoustic wave filter element.

FIG. 5 and FIG. 6 show the actual shape of a surface acoustic wave filter element 140, when aperture length L1 of the driving electrode 20 of a parallel resonator pair $P_0$ (comprising P01 and P02) and the number of electrode pairs N are set as described above in methods {1} and {2}, respectively (i.e., the number of electrode pairs is identical to the number of electrode finger pairs). To be more specific, FIG. 5 and FIG. 6 schematically show the shape of the filter element 140, in which the number of electrode pairs N looks smaller than actuality.

In FIG. 5 and FIG. 6, the four serial resonators S1 through S4 comprising driving electrodes 20S and reflection electrodes 30S and the three parallel resonators P01, P02 and P, each having a basic shape pattern as shown in FIG. 2, connected to each other as shown in FIG. 3, are formed on a piezoelectric board 150 made of 36° Y—X LiTaO$_3$. That is, the driving electrode 20S in each of the four serial resonators S1 through S4 is cascade connected to the neighboring one via wiring electrodes 151,152 and 153. Additionally, because driving electrode 20P0 of parallel resonator P01 is connected via wiring electrode 151 between respective driving electrodes 20S of serial resonators S1 and S2, driving electrode 20P0 of parallel resonator P02 is connected via wiring electrode 153 between respective driving electrodes 20S of serial resonators S3 and S4. Further, driving electrode 20S of the serial resonator S4 is connected via wiring electrode 154 to driving electrode 20P of parallel resonator P.

As well, an input electrode 155 is formed, being connected to the other end of driving electrode 20S of serial resonator S1 of the initial stage. Furthermore, a part of wiring electrode 154, connecting driving electrode 20S of serial resonator S4 in the last section stage to driving electrode 20P of parallel resonator P in the last section stage, forms an output electrode 156.

In addition, ground electrodes (GND electrodes) 157 are formed, being connected to the other end of driving electrodes 20P0, 20P0, 20P respectively of parallel resonators P01, P02 and P. Besides, pairs of reflectors 30P0, 30P02 and 30P are formed on both sides of parallel resonators P01, P02 and P, respectively. The respective aperture lengths of the pairs of reflectors 30P0, 30P02 and 30P of parallel resonators P01, P02, and P are equal to the aperture lengths of the corresponding driving electrodes 20P0, 20P0 and 20P.

As shown in both FIGS. 5 and 6, as a result of replacing a part conventionally using two parallel resonators P and P with a single parallel resonator $P_0$, whereas the number of parallel resonators has been reduced from five to three, and whereas the number of section stages has been reduced from four stages to three stages, therefore the length of a wiring electrode 152 between serial resonators S2 and S3 has been shortened, as compared with the prior art. This enables the length along the A direction of the element to be shorter than the one attainable by convention. Thus, as a result, the overall size of a surface acoustic wave filter element can be made smaller than that of the conventional one with little change in the characteristics as a band-pass filter.

In this manner, in a surface acoustic wave filter element of a ladder shaped filter, because no less than two consecutive parallel resonators hitherto formed separately can be replaced (synthesized) by one parallel resonator without materially deteriorating the characteristics as a band-pass filter, element size in case of using multiple stages can be made smaller than that attainable by the prior art. This enables a packaged surface acoustic wave filter to be even more compact and lighter in weight.

More specifically, the serial resonators S1 through S4, the parallel resonators P01, P02 and P, as well as the electrodes 151 through 157 are constructed, after stacking in laminated layers of Al (aluminum) to the thickness of e.g. about three thousand angstroms [3000 Å] (e.g. by a spattering method or an evaporation method) on top of the piezoelectric board 150 made of LiTaO$_3$, by patterning Al using a photolithograph technic.

Figure 7:
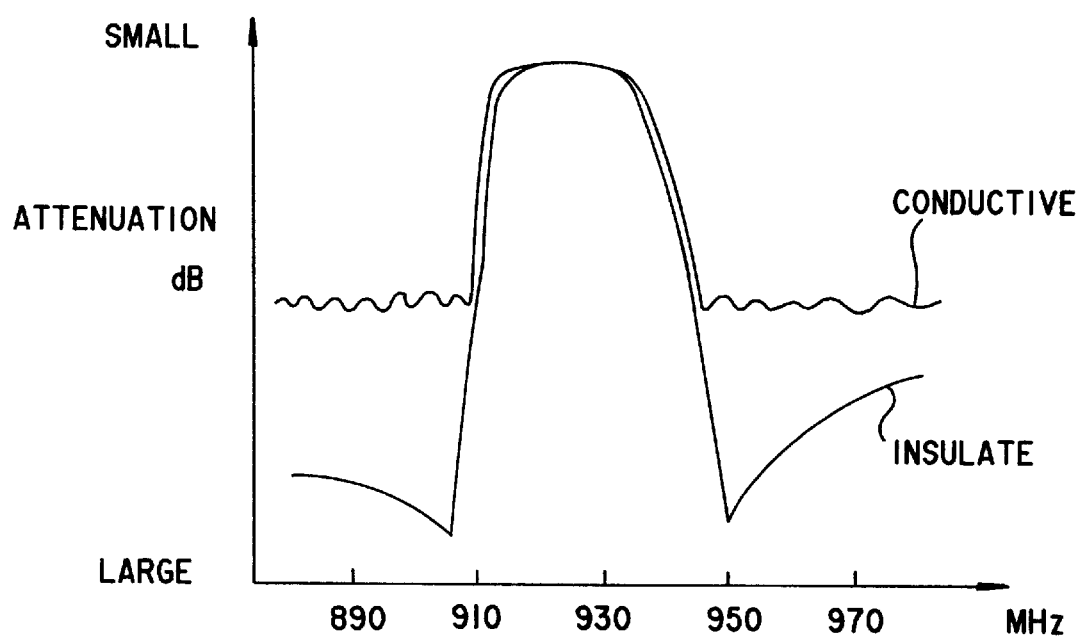
FIG. 7 is a graph illustrating the difference in extra-band attenuations between a case in which the ground electrodes of parallel resonators in a surface acoustic wave filter element are mutually insulated and a case in which they are electrically connected.

FIG. 7 is a graph illustrating the difference in extra-band attenuations between a case in which the ground electrodes of parallel resonators in a surface acoustic wave filter element are insulated with each other and a case in which the ground electrodes of parallel resonators in a surface acoustic wave filter element are electrically connected with each other.

Also, inasmuch as the common use in the element of the ground electrodes (GND electrodes) 157 of parallel resonators P01, P02 and P with those of other parallel resonators prevents an enough attenuation in an extra-band range from being obtained as shown in FIG. 7, the respective ground electrodes 157 of parallel resonators P01, P02 and P are formed mutually separated within the element as shown in FIG. 5 and FIG. 6. To be more specific, the "conductive" curve in FIG. 7 indicates the attenuation characteristics when ground electrodes 157 of respective parallel resonators P01, P02 and P are made common with ground electrodes 157 of other parallel resonators, where the higher an attenuation (in decibels [dB]) is, the closer to the origin it is shown along the vertical axis.

Figure 8A:
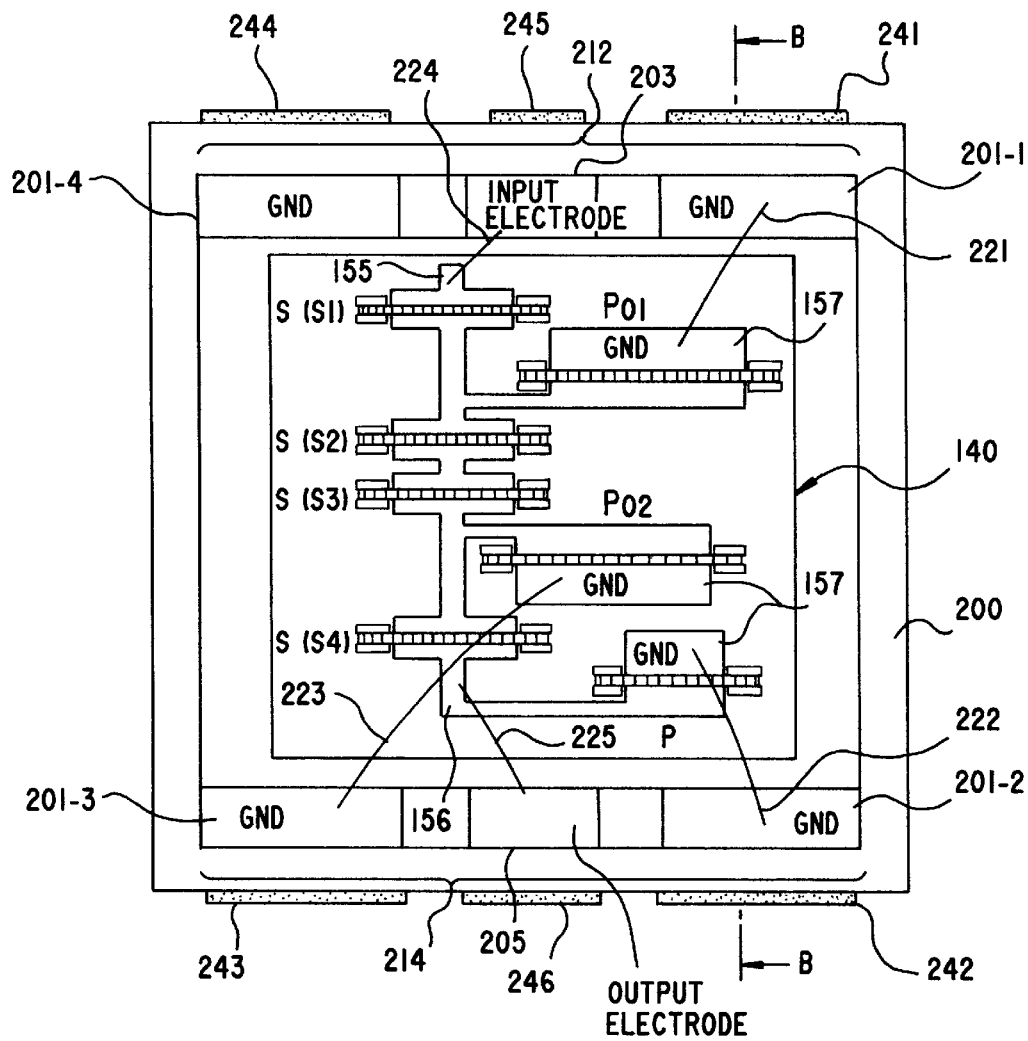
FIG. 8A is a sketch illustrating the upside view of a surface acoustic wave filter element packaging pursuant to an embodiment.

FIG. 8A is a sketch illustrating the upside view of a surface acoustic wave filter element packaging.

Figure 8B:
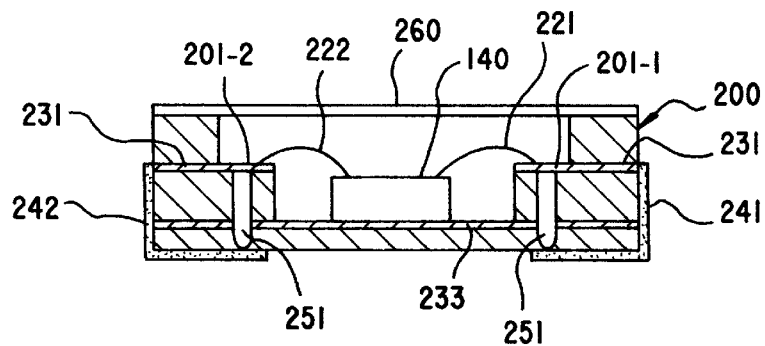
FIG. 8B is a sketch illustrating the B—B section of the surface acoustic wave filter element packaging shown in FIG. 8A.

FIG. 8B is a sketch illustrating the B—B section of the surface acoustic wave filter element packaging shown in FIG. 8A.

To be more specific, FIG. 8A schematically shows the surface acoustic wave element 140 shown in FIG. 5 and FIG. 6.

More specifically, FIG. 8A and FIG. 8B show, from the standpoints discussed in the description of FIG. 5 and FIG. 6, a packaging example of loading the surface acoustic wave filter element 140 on a ceramic multiple layer alumina package, which is an LCC (Leadless Chip Carrier) package of a surface packaging type.

The ceramic package is based on a ceramic board 200 with three ceramic sheets stacked in layers, in which a ground line 233 is pattern formed on the ceramic sheet of the first layer and ground lines 231 and input/output signal lines (not shown) are pattern formed on the ceramic sheet of the second layer. Here, the patterns are formed e.g. by a screen printing method. Then, the surface acoustic wave filter element 140 (shown in FIG. 5 and FIG. 6) is loaded on the ceramic sheet of the first layer of the multiple layer ceramic board 200 on which the ground lines 231 are formed.

As shown in FIG. 8A, the four mutually electrically insulated ground pads (pads for grounding) 201-1 through 201-4 are formed at sides 212 and 214 of the ceramic sheet surface of the second layer of the multiple layer ceramic board 200. Also, at the center of these sides 212 and 214, a pad 203 for an input signal is formed between ground pads 201-1 and 201-4, and a pad 205 for an output signal is formed between ground pads 201-2 and 201-3.

That is, parts of the patterns of the ground lines 231 shown by hatching in FIG. 8B form the ground pads 201-1 through 201-4. As well, L shaped external connectors 241 through 246, electrically connected to each of the ground pads 201-1 through 201-4, 203, and 205, are provided on the outside of the multiple layer ceramic board 200, as shown in FIGS. 8A and 8B.

Furthermore, the ground electrodes 157 of parallel resonators P01, P and P02 are connected via wires 221, 222 and 223 made e.g. of Al (aluminum) or Au (gold) to ground pads 201-1, 201-2 and 201-3, respectively, as shown in FIG. 8A. Then, ground pads 201-1, 201-2 and 201-3 are connected to external terminals 241, 242 and 243, respectively, both directly and indirectly via a via hole 251, as shown in FIG. 8B.

As well, the via hole 251 connects a ground line 231 to a ground line 233 in respective layers. Thus, a good ground effect is obtained by connecting the respective ground electrodes 157 of parallel resonator P01, P02 and P of the surface acoustic wave filter element 140 individually to ground pads 201-1, 201-3 and 201-2, respectively, instead of to the same ground pad on the multiple-layer ceramic board 200. Therefore, deterioration in an extra-band attenuation upon using multiple stages can be prevented, and at the same time the higher performance of a surface acoustic wave filter can be ascertained.

Here, the input electrode 155 of serial resonator S1 on the input side is connected via the bonding wire 224 (made e.g. of Al or Au) to the input pad 203, the output electrode 156 of serial resonator S4 on the output side is connected via wire 225 made e.g. of Al or Au to the output pad 205. Further, as described earlier, on top of the multiple layer ceramic board 200 loaded with the surface acoustic wave element 140 at the center of the ceramic sheet on the first layer, a cap 260 is buried for protecting from an outside environment the surface acoustic wave element 140.

Although the above embodiment assumes the use of LiTaO$_3$ (lithium tantalumate) as a material for the piezoelectric board 150, such materials as LiNbO$_3$ (lithium niobiumate), SiO$_2$ (silicon dioxide [crystalline quartz]), TeO$_2$ (technetium dioxide), ZnO (zinc monoxide) can also be used. Also, the package of a surface acoustic wave filter element 140 is by no means limited to an LCC (Leadless Chip Carrier) package manufactured by a ceramic layer method described in the above embodiment, but can be other package types, such as a surface package type and a can package type.

Furthermore, this invention is applicable not only to a surface acoustic wave filter having a configuration in which both a serial resonator S and a parallel resonator P are connected to an output terminal as shown in FIG. 3 but also to a surface acoustic wave filter having a configuration in which only a serial resonator S is connected to an output terminal. Additionally, neither the structure of a surface acoustic wave filter element is limited to the one shown in FIG. 5 and FIG. 6, nor the numbers of serial resonators and parallel resonators used and their connections are limited.

What is claimed is:

1. A surface acoustic wave filter element comprising:
   a plurality of surface acoustic wave resonators as a plurality of series resonators; and
   a plurality of parallel resonators connected in a ladder shape, each of said plurality of surface acoustic wave resonators having a piezoelectric board, a driving electrode provided on said piezoelectric board, and two reflecting electrodes provided on said piezoelectric board for holding a driving electrode from both sides, wherein
      at least one first parallel resonator not being connected between two series resonators;
      at least one second parallel resonator being connected between two series resonators and having a driving electrode whose area is about plural times as large as an area of a driving electrode of said first parallel resonator; and
      a number of said series resonators is equal to a number obtained by adding a number of said second parallel resonator said plural times.

2. The surface acoustic wave filter element as set forth in claim 1, wherein:
   ground electrodes of all parallel resonators are each provided electrically insulated from each other.

3. A method of providing a surface acoustic wave filter element comprising a plurality of surface acoustic wave resonators as a plurality of series resonators and a plurality of parallel resonators connected in a ladder shape, each of said plurality of surface acoustic wave resonators having a piezoelectric board, a driving electrode provided on said piezoelectric board, and two reflecting electrodes, provided on said piezoelectric board, for holding said driving electrode from both sides, said method comprising the steps of:
   making another parallel resonator having a driving electrode whose area is about plural times as large as an area of a driving electrode of a parallel resonator;
   replacing more than one of said plurality of parallel resonators with said another parallel resonator which has the driving electrode whose area equals a total area of the driving electrodes of said more than one of said parallel resonators, and is connected to at least one series resonator;
   setting a number of series resonators before said replacement equal to a number of series resonators after said replacement; and
   increasing a value of a ratio Cp/Cs of a parallel resonator capacitance Cp to a series resonator capacitance Cs connected to said parallel resonator by said replacement.

4. The method of providing a surface acoustic wave filter element as set forth in claim 3, wherein:
   ground electrodes of all parallel resonators are each provided electrically insulated from each other.

5. The method of providing a surface acoustic wave filter element according to claim 3, wherein:
   said more than one of said parallel resonators connected to at least one series resonator are consecutive.

6. A surface acoustic wave filter comprising:
   a surface acoustic wave filter element comprising a plurality of surface acoustic wave resonators as a plurality of series resonators and a plurality of parallel resonators connected in a ladder shape, each of said plurality of surface acoustic wave resonators having a piezoelectric board, a driving electrode provided on said piezoelectric board, and two reflecting electrodes, provided on said piezoelectric board, for holding said driving electrode from both sides;
   at least one first parallel resonator not being connected between two series resonators;
   at least one second parallel resonator being connected between two series resonators and having a driving electrode whose area is about plural times as large as an area of a driving electrode of said first parallel resonator;
   a number of said series resonators is equal to a number obtained by adding a number of said second parallel resonator said plural times;

ground electrodes of all parallel resonators are each provided electrically insulated from each other; and a package packages said surface acoustic wave filter element such that the ground electrodes of all parallel resonators are connected to separate electrode pads for grounding.

7. A method of providing a surface acoustic wave filter having a surface acoustic wave element which comprises a plurality of surface acoustic wave resonators as a plurality of series resonators and a plurality of parallel resonators connected in a ladder shape, each of said plurality of surface acoustic wave resonators having a piezoelectric board, a driving electrode provided on said piezoelectric board, and two reflecting electrodes, provided on said piezoelectric board, for holding said driving electrode from both sides, said method comprising the steps of:

making another parallel resonator having a driving electrode whose area is about plural times as large as an area of a driving electrode of a parallel resonator;

replacing more than one of said plurality of parallel resonators with said another parallel resonator which has the driving electrode whose area equals a total area of the driving electrodes of said more than one of said parallel resonators, and is connected to at least one series resonator;

setting a number of series resonators before said replacement equal to a number of series resonators after said replacement;

increasing a value of a ratio $Cp/Cs$ of a parallel resonator capacitance $Cp$ to a series resonator capacitance $Cs$ connected to said parallel resonator by said replacement;

providing ground electrodes of all parallel resonators electrically separated from each other; and packaging said surface acoustic wave filter element such that the ground electrodes of all parallel resonators are connected to separate electrode pads for grounding.

8. The method of providing a surface acoustic wave filter according to claim 7, wherein:

said more than one of said parallel resonators connected to at least one series resonator are consecutive.

* * * * *